United States Patent
Conte et al.

(10) Patent No.: US 6,858,254 B2
(45) Date of Patent: Feb. 22, 2005

(54) EASILY LOADED AND UNLOADED GETTER DEVICE FOR REDUCING EVACUATION TIME AND CONTAMINATION IN A VACUUM CHAMBER AND METHOD FOR USE OF SAME

(75) Inventors: Andrea Conte, Milan (IT); Francesco Mazza, Milan (IT); Marco Moraja, Milan (IT)

(73) Assignee: SAES Getters S.p.A., Milan (IT)

( * ) Notice: Subject to any disclaimer, the term of this patent is extended or adjusted under 35 U.S.C. 154(b) by 0 days.

(21) Appl. No.: 10/422,205

(22) Filed: Apr. 23, 2003

(65) Prior Publication Data
US 2003/0207030 A1 Nov. 6, 2003

Related U.S. Application Data

(62) Division of application No. 09/546,722, filed on Apr. 11, 2000, now Pat. No. 6,589,599.

(30) Foreign Application Priority Data
Apr. 12, 1999 (IT) .......................................... MI99A0744

(51) Int. Cl.[7] .......................... B05D 3/00; F04B 37/02
(52) U.S. Cl. .......................... 427/294; 417/48; 417/53; 438/471
(58) Field of Search ................................ 427/250, 294; 417/48, 53; 438/471

(56) References Cited

U.S. PATENT DOCUMENTS

| 5,250,324 A | 10/1993 | Claar |
| 5,320,496 A | 6/1994 | Manini et al. |
| 5,324,172 A | 6/1994 | Manini et al. |
| 5,500,182 A | 3/1996 | Roach |
| 5,879,134 A | 3/1999 | Lorimer et al. |
| 5,911,560 A | 6/1999 | Krueger et al. |
| 6,142,742 A * | 11/2000 | Krueger et al. ............... 417/48 |
| 6,508,632 B1 * | 1/2003 | Conte et al. ................... 417/48 |
| 6,620,297 B2 * | 9/2003 | Conte et al. ........... 204/192.11 |

FOREIGN PATENT DOCUMENTS

| EP | 0 511 733 A1 | 3/1992 |
| WO | WO 94/02957 | 4/1993 |

* cited by examiner

Primary Examiner—Brian K. Talbot
(74) Attorney, Agent, or Firm—Perkins Coie LLP

(57) ABSTRACT

A getter device is shaped like a substrate used in a deposition process. Embodiments of the device include a powdered getter material coated onto one or both sides of a support with a narrow rim portion left uncoated so that the device can be manipulated by automatic handling equipment. A method for using the getter device includes providing a vacuum chamber and automatic handling equipment, loading the device into the chamber, reducing the chamber pressure to a desired value by using the getter device in conjunction with an external pump, removing the getter device and replacing it with a substrate, and depositing a thin film on the substrate. The getter device can be in an activated state when loaded into the chamber, or it can be activated after being loaded by employing heating equipment ordinarily used to heat substrates placed in the chamber. The getter material of the device may also be activated in a separate activation chamber before the getter device is loaded into the vacuum chamber.

9 Claims, 9 Drawing Sheets

EASILY LOADED AND UNLOADED GETTER DEVICE FOR REDUCING EVACUATION TIME AND CONTAMINATION IN A VACUUM CHAMBER AND METHOD FOR USE OF SAME

CROSS REFERENCE TO RELATED APPLICATIONS

This application is a Divisional of U.S. Ser. No. 09/546,722, filed Apr. 11, 2000 now U.S. Pat. No. 6,589,599.

BACKGROUND OF THE INVENTION

1. The Field of the Invention

The present invention provides a getter device advantageously shaped like a substrate for use in a thin film deposition system and a method for its use.

2. Background

Processes for depositing thin films onto substrates are widely used in the manufacture of a wide array of commercial products. Examples of these processes include the fabrication of integrated electronic circuits (ICs) in which circuits are formed on a semiconductor substrate; the manufacture of data storage media, such as compact disks (CDs), where a thin layer of aluminum is deposited onto a substrate of a transparent plastic; the production of computer hard disks where a magnetic material is deposited onto a substrate such as aluminum; and the production of flat panel displays in which active elements are commonly created on glass substrates. Processes for depositing thin layers are also being adapted to the developing field of micromechanical devices, where micron-scale mechanical structures are fabricated with similar techniques to those utilized in the production of ICs. The main industrial techniques for the deposition of thin layers include chemical deposition from the vapor phase and physical deposition from the vapor phase, widely known in the art as "chemical vapor deposition" and "physical vapor deposition" respectively or by their acronyms "CVD" and "PVD".

In CVD processing, two or more gaseous species are caused to react in an evacuated chamber containing a substrate. The reaction product forms a solid deposit on the substrate in the form of a thin film or layer. The degree to which the chamber must be evacuated will vary according to the particular CVD process employed. Some systems, those known as low-pressure or alternately ultra-high vacuum, can require initial evacuations of the deposition chamber to a pressure value in the range of $10^{-8}$–$10^{-9}$ mbar. Hereinafter, reference to CVD processing will refer to the low-pressure variants unless stated otherwise.

Physical vapor deposition (PVD) actually encompasses a number of different techniques that all share the following common features:

a target formed of a material to be deposited, generally having the shape of a squat cylinder or a disk, is positioned in a deposition chamber in front of a substrate and parallel thereto; and the chamber is initially evacuated to a base pressure and thereafter back-filled with an inert gas, generally argon or another noble gas, to a pressure of about $10^{-2}$–$10^{-5}$ mbar; a potential difference of some thousands volts applied between the supports of the substrate and the target (providing the latter with a cathodic potential) generates a plasma of electrons and positive ions in the space between the substrate and the target; the positive ions are accelerated by the electric field into the target causing atoms or "clusters" of atoms to erode or "sputter" off of the surface of the target and into the atmosphere of the chamber; material thus eroded condenses onto the substrate to form a thin film or layer.

As is well known in the art, commercially useful processes frequently include the deposition of a plurality of successive thin layers which may be performed in a succession of deposition chambers or in a single chamber configured to perform multiple depositions. Hybrid processes, comprising aspects of both CVD and PVD processes are also well known in the art.

It is further understood in the art that the properties of thin layer devices, particularly ICs, are strongly dependent on the presence of defects within the deposited layers. These defects are most commonly due to the inclusion of impurity atoms or molecules within the deposited layers. Consequently, it is important to minimize the possible sources of contamination in all processing steps. For example, contamination can be reduced by using components of the highest possible purity (reactive gases in the case of CVD, targets in case of PVD, and inert gases generally) and ensuring the highest cleanliness of all surfaces within the production system and especially within the gas distribution system and each deposition chamber.

Presently, to create high quality films and to do so with the greatest efficiency, thin film deposition processes are commonly performed in systems comprising a plurality of chambers, each configured for a specific operation. For example, deposition steps are performed in deposition chambers, while conditioning chambers can be configured for cleaning or thermal processing steps like pre-heating substrates. Systems comprising multiple chambers can be arranged linearly such that one is directly connected to the next. Alternatively, multiple chambers can be disposed around a central transfer chamber.

Chambers are connected to one another by means of valves that are normally opened only to allow the transfer of substrates from one chamber to another. Substrates are passed between chambers by automated substrate handling equipment, in general mechanical arms that are configured to grasp or support a substrate typically along an edge by the use of tangs, clamps, and guides. The valves and the automated handling equipment are typically configured to the dimensions of the substrates, and are thus designed to accommodate objects that are both thin and broad. Semiconductor substrates, for example, are generally circular, often with a machined flat segment or notch to indicate crystallographic orientation, with thicknesses between about 0.5 mm and about 1 mm and lateral dimensions between about 150 mm to about 300 mm. Substrates used in the production of flat panel displays, on the other hand, are commonly rectangular with thicknesses between about 1 mm and 5 mm and lateral dimensions between about 10 cm and 1 meter.

In order to guarantee the highest cleanliness possible, all chambers are generally kept under vacuum with the highest vacuum levels being maintained in the deposition chambers. As is well known in the art, higher vacuum levels are typically achieved through the use of a series of pumps, each intended to operate in a different pressure range. Evacuation is typically initiated with a low-vacuum mechanical pump (e.g. a rotary pump) that is effective down to a pressure range of about 1–$10^{-2}$ mbar. Lower pressures can be achieved with medium and high-vacuum pumps such as turbomolecular or cryogenic pumps.

A simple example of a process system comprising multiple chambers arranged around a transfer chamber will serve to illustrate the pathway traveled by a substrate. Substrates are initially arranged in a suitably shaped carrier (e.g. a cassette or a pod) that is loaded into a first chamber. The inner walls of the carrier are provided with tangs or guides for the purpose of keeping the substrates separate from each other, and to simplify automated handling operations. A vacuum of about $10^{-5}$–$10^{-6}$ mbar is achieved in the first chamber after the substrates are first introduced, and then a valve is opened between the first chamber and the transfer chamber. A mechanical arm removes a substrate from the carrier and transfers it to the transfer chamber where the pressure is maintained at a level lower than those in the first chamber, generally about $10^{-7}$ mbar.

Next, a mechanical arm is employed, for example, to transfer the substrate from the transfer chamber to a deposition chamber through a second valve. The mechanical arm places the substrate on a sample holder near the center of the chamber. Typically, the sample-holder is supported on a pedestal that is moveable in some systems. The ability to heat the deposition zone, the region within the chamber surrounding the sample holder, is generally provided in deposition chambers both to help degas the pedestal during the initial stages of evacuation and to promote more homogeneous depositions. Deposition chambers are frequently provided for this purpose with heating equipment, such as electrical resistors or infra-red lamps, to heat the deposition zone either from the inside or from the outside of the chamber through one or more quartz windows.

The vacuum level required for thin film depositions in most manufacturing processes is generally about $10^{-8}$ mbar, which requires between about 4 to about 12 hours to achieve. After a sufficient vacuum is obtained in a deposition chamber a thin layer can be deposited according to the technique for which the chamber is configured, for example CVD or PVD. The technique may also include one or more preliminary operations that need to be performed at the deposition vacuum level but before the actual deposition. After the deposition has been completed the substrate can then be transferred, again by means of automated handling equipment and transfer chambers, either to another chamber or back to a carrier to be removed from the system.

Ideally, systems for depositing thin films should always be kept isolated from the atmosphere. However, vacuum chambers must be opened periodically, for example, to perform maintenance on automated components, to clean interior surfaces, and in the case of PVD, to replace exhausted targets or to switch to a different target in order to use the chamber to deposit a different material. Each time a chamber is brought to ambient pressure its interior surfaces, the surfaces of equipment disposed within the chamber, and the surfaces of any targets will tend to adsorb atmospheric gases, in particular water vapor. These adsorbed gases are then continuously released into the chamber when the chamber is next evacuated. The balance between the release of adsorbed gases from interior surfaces, commonly known as degassing, and the gas removal ("pumping") speed of associated vacuum pumps substantially determines the base pressure of the system, where the base pressure is the lowest pressure attainable in a commercially reasonable length of time.

Lowering the base pressure necessarily results in fewer impurities in the process atmosphere and is therefore desirable. Base pressures are typically between about $10^{-7}$ and about $10^{-9}$ mbar. At these vacuum levels the chamber cleanliness is generally considered acceptable for starting a new cycle of depositions. It will be appreciated, however, that in some instances it is desirable to perform depositions and other operations at a preset pressure above the level of the base pressure. A preset value above the base pressure may be used, for instance, during the cleaning of a target and in other preliminary operations. Additionally, it may be desirable to use a preset value above the base pressure for depositions where film quality is acceptable at such pressures. The further value inherent any time a preset value above the base pressure is used is that it can be achieved more quickly than the base pressure. Faster pump-down cycles lead to greater throughput and therefore to greater yields per unit time.

Typically, in order to improve a base pressure, each time a chamber is evacuated after being opened to the atmosphere it is simultaneously heated to a temperature in the range of about 100° C.–300° C. This treatment is commonly known as "baking." During a bake the rate of degassing from the surfaces within a chamber is increased, thus removing much of the gas initially adsorbed from the atmosphere. It is well known that degassing can be further increased by increasing the pumping speed. Thus, increasing the pumping speed during baking further reduces the quantity of residual adsorbed gases on surfaces within the chamber. Put another way, more aggressive pumping during a baking operation results in a cleaner vacuum chamber.

All else being equal, providing a cleaner vacuum chamber while maintaining an equivalent pumping speed after baking will result in a lower base pressure in the chamber. This is so because lowering the amount of residual adsorbed gas on interior surfaces reduces subsequent degassing, and base pressure is a balance between degassing and pumping speed. It should also be noted that by providing a cleaner vacuum chamber while maintaining an equivalent pumping speed after baking one can more quickly achieve a specific pressure value above the base pressure. Therefore, in situations where further reducing the base pressure is not considered important, one can bring a vacuum chamber down to an operational pressure above the base pressure more quickly by improving the pumping during baking.

In the case of PVD, targets are subjected to an additional cleaning treatment after being exposed to the ambient atmosphere. This treatment, commonly known as "burnin," comprises performing a deposition on a sacrificial substrate and requires between about half an hour and about 4 hours. The deposition thus performed erodes away the contaminated surface of the target to expose a fresh clean surface. The contaminated surface material is deposited on the sacrificial, or "dummy," substrate which then may be discarded.

The use of getter materials and devices inside thin film deposition chambers has already been disclosed in patent application EP-A-693626, the publications of international patent application WO 96/13620 and WO 97/17542, and in U.S. Pat. No. 5,778,682. The European patent application EP-A-926258, in the name of the assignee of the present application, also discloses the use of getter systems in PVD processes.

Getter materials that have been used for the production of prior art getter devices include metals such as zirconium (Zr), titanium (Ti), niobium (Nb), tantalum (Ta), and vanadium (V), and the alloys of these metals. Additionally, these metals, alone or in combination, have been further combined with one or more other elements chosen from among chromium (Cr), manganese (Mn), iron (Fe), cobalt (Co), nickel (Ni), aluminum (Al), yttrium (Y), lanthanum (La), and the rare-earth elements, Commercially popular getter materials include the binary alloys Ti—V, Zr—V, Zr—Fe and Zr—Ni and ternary alloys Zr—Mn—Fe and Zr—V—Fe.

Getter materials have been formed into getter devices by various different methods according to the prior art. Getter materials may be formed through traditional metallurgical processes such as casting and working, but more commonly they are formed through powder metallurgy. Powder metallurgy allows the getter material to be prepared with a tailored particle size distribution and to be sintered into a body with good mechanical strength and a desired degree of porosity. For gettering purposes, porosity is advantageous to increase the specific surface area (surface area/gram of material) of the getter material in contact with the atmosphere to be pumped.

Where getter materials need to be applied in very thin layers other techniques are often employed. A getter material deposited on a support can be obtained, for example, by PVD. The preparation of getter devices by PVD is described in the publication of international patent application WO 97/49109. This technique provides the advantage of allowing the deposition of a getter material onto many kinds of supports, including glasses and ceramics. Advantageously, deposits obtained by PVD techniques tend not to be sources of particle contamination.

Additionally, getter materials can be deposited onto a support in the form of a powder. The deposition of powders can be carried out by cold rolling, as is well known in the field of powder metallurgy, however powders can only be applied to metallic supports. Another technique is to spray a suspension of getter particles in a suitable solvent onto a heated support, as described in patent application WO 95/23425 incorporated herein by reference. Furthermore the support may be coated with particles of a getter material according to an electrophoretic technique. In this technique, however, the support must be electrically conductive. Electrophoretic deposition techniques are described in U.S. Pat. No. 5,242,559 which is incorporated herein by reference. Finally, depositions of getter material powders onto supports can be carried out by a serygraphic technique, as described in the publication of international patent application WO 98/03987, also incorporated herein by reference. The serygraphic technique is particularly advantageous because it provides for depositing powdered getter materials onto widely different types of supports including metals and insulators. Further, the serygraphic technique allows for the formation of patterned deposits where a portion of a coated support surface, for example, remains uncoated.

The references described above that teach getter devices, however, disclose only systems that are fixed within a vacuum chamber and continue to remain in the chamber while depositions or other processes are performed. A significant disadvantage of the foregoing prior art is that substantial modifications are often required in order to configure a processing chamber to accommodate such getter devices and associated hardware such as heaters and shields. These modifications increase the size, the complexity, and the cost of a vacuum chamber, and increased size generally implies an increased internal volume and a longer evacuation time. Further, getter devices of the prior art are not easily removed from a chamber without opening it to the ambient atmosphere.

As is well known in the art, getter materials require for their operation an initial activation treatment at temperatures between about 250° C. and about 900° C. for times ranging between about a few minutes and about an hour. The specific time and temperature necessary to activate a getter will vary according to the particular composition of the getter material as well as other factors. It is further well known that activated getter materials cannot be exposed to partial pressures of reactive gases higher than about $10^{-3}$ mbar, and that unactivated getter materials cannot be activated at such pressures, because either act can result in the combustion of the getter material.

It will be appreciated that not all gases are reactive with respect to a getter material, and therefore total pressures above about $10^{-3}$ mbar can still be safe so long as the partial pressures of the reactive gases remains below about $10^{-3}$ mbar. Reactive gases typically include species such as oxygen, water, carbon dioxide, carbon monoxide, hydrogen, and in some instances nitrogen. Examples of gases that are non-reactive include the noble gases such as helium and argon. Therefore, it would still be safe to introduce a getter material into a vacuum chamber containing argon at a pressure of about $10^{-2}$ mbar so long as the sum of the partial pressures of any reactive gases remains below about $10^{-3}$ mbar. It would also be safe, under such conditions, to activate a getter material.

It is an object of the present invention, therefore, to provide a getter device that can be easily transported into and out of an evacuated chamber instead of being permanently installed. It is another object of the present invention to provide a method for the use of such a getter device for increasing the pumping of a vacuum chamber to achieve either a lower base pressure or to reach a set operating pressure more quickly.

SUMMARY OF THE INVENTION

The present invention provides an easily loaded and unloaded getter device for reducing evacuation time and contamination in a vacuum chamber. The getter device comprises a getter body having essentially the shape of a substrate used in a deposition process. Forming the getter body to have the same shape as a substrate allows the getter device to be loaded and unloaded with respect to a chamber by existing automatic handling equipment already configured to load and unload substrates. Further, the shape allows the getter device to be placed into a substrate carrier for introduction into a processing system. Further still, most substrates are broad and thin, and a getter device having such a shape will advantageously have a high surface area per unit weight of getter material. Some embodiments of the present invention are shaped like semiconductor wafers use in semiconductor fabrication, while others are shaped like the rectangular substrates used in the production of flat panel displays.

A getter device of the present invention is preferably formed of a powder of at least one getter material. Fabrication from a powder provides a high specific surface area for improved gettering capacity. Additional embodiments of the present invention are directed to a getter body comprising a support and a first getter layer formed of at least one deposit of a getter material on a first face of the support. In further embodiments the getter body further comprises a second getter layer formed of at least one deposit of a getter material on a second face of the support. Still other embodiments further include a first uncoated rim portion on the first face of the support and a second uncoated rim portion on the second face of the support. The support is advantageous because it provides mechanical strength to the getter body. Uncoated rim portions allow getter devices of the present invention to be manipulated by automated handling equipment typically configured to handle substrates by their edges. Therefore, by leaving rim portions uncoated, the clamps, tangs, and guides used by automated handling equipment to transfer substrates will not come into contact with the getter layers and create particulate contamination.

Providing a first getter layer on only a first face of the support creates a getter device suitable for use in deposition systems that are configured to deposit materials on only one side of a substrate, such as in semiconductor processing and in the manufacture of compact disks (CDs). In these systems a substrate is commonly supported on a sample holder such that one face of the substrate rests in contact with the holder. Therefore, to avoid creating particulate contamination, it is desirable to leave uncoated the face of the support that would contact the holder. Similarly, some deposition systems are configured to deposit onto both sides of a substrate, such as in the manufacture of hard disks for computers. For these systems a getter device would be desirable where both sides of the support are coated with getter material to further increase its gettering capacity.

Getter devices of the present invention provide several advantages over the prior art. Getter devices of the present invention do not need to be permanently mounted within a process chamber. Consequently, getter devices of the present invention may be readily used in conjunction with any vacuum chamber configured to accept a substrate, regardless of whether the chamber already includes a getter pump. An easily transportable getter device also removes the need for mounting brackets, complex shielding to protect the getter material of the device, and additional heaters to periodically activate the getter material. Eliminating brackets, shields, and heaters allows the chamber to have a smaller internal volume so it can be more rapidly evacuated to a desired vacuum level. Removing these components can simplify the design and manufacture of vacuum chambers and therefore help reduce their cost. Further, an easily transportable getter device can be removed from a chamber without having to resort to a time consuming tear-down procedure that exposes the chamber to the ambient atmosphere and thereafter requires a lengthy re-assembly, bake-out, and pump-down.

The present invention also provides a method for increasing the yield of a manufacturing process that includes the deposition of a thin layer in a vacuum chamber. The method comprises introducing a getter device into the vacuum chamber before or during evacuation with the same automated substrate handling equipment used for transferring substrates. An unactivated getter device can be loaded before evacuation begins, and then after a pressure of about $10^{-3}$ mbar or less has been achieved the getter material can be activated with heaters configured to heat a substrate. An activated getter device can be loaded after a pressure of about $10^{-3}$ mbar or less has been achieved in the chamber. Some embodiments of the method include activating the getter material in a separate activation chamber before the getter device is loaded into the vacuum chamber. Further embodiments of the method provide for the use of a getter device in a vacuum chamber where the total pressure is above about $10^{-3}$ mbar, provided that the sum of the partial pressures of all reactive gases remains below about $10^{-3}$ mbar and the balance of the atmosphere within the chamber comprises non-reactive gases such as noble gases.

The method of the invention further includes continuing the chamber evacuation while maintaining therein the activated getter device until a desired pressure is achieved, and then removing the getter device from the chamber. Thereafter, a substrate can be loaded into the vacuum chamber and a deposition of a thin film performed. In some embodiments on the method of the present invention a preliminary operation, such as the burn-in of a PVD target, is performed in place of a deposition.

The method of the invention is advantageous because it allows the pressure within a vacuum chamber both to be reduced to a preset value more quickly and to be reduced to a lower base pressure. A lower base pressure results in lower impurity levels within the vacuum chamber leading to higher quality films and higher production yields. The method is also advantageous because it may be used with equipment that isn't presently configured to include a getter pump.

These and other aspects and advantages of the present invention will become more apparent when the detailed description below is read in conjunction with the accompanying drawings.

BRIEF DESCRIPTION OF THE DRAWINGS

The present invention will be readily understood by the following detailed description in conjunction with the accompanying drawings, with like reference numerals designating like elements.

DETAILED DESCRIPTION OF THE PREFERRED EMBODIMENTS

Figure 1:
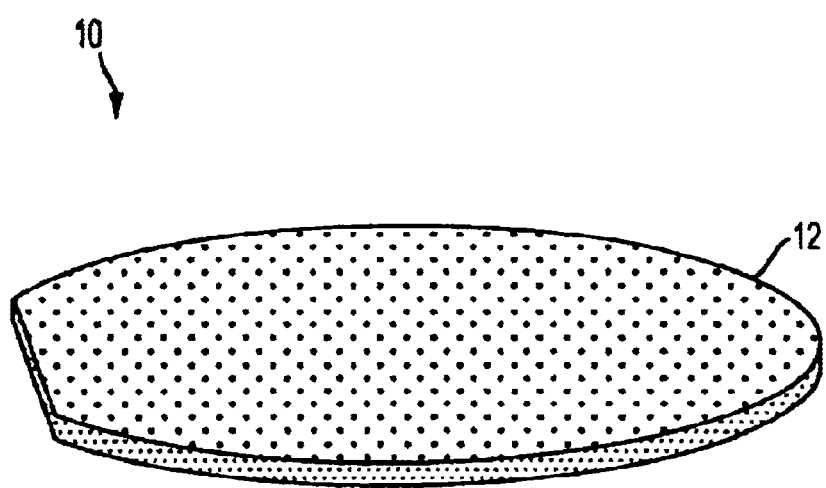
FIG. 1 shows a getter device of the present invention comprising a getter body.

FIG. 1 is a getter device 10 according to one embodiment of the present invention. The getter device 10 comprises a getter body 12 having essentially the shape of a substrate used in a deposition process. Those skilled in the art will appreciate that because the getter body 12 has essentially the same shape as a substrate it may therefore be manipulated by automatic handling equipment configured to transport substrates. Consequently, the getter device 10 of the present invention may be easily loaded and unloaded by automatic handling equipment into and out of any chamber that is configured to accept a substrate.

Getter body 12 has essentially the same shape as a substrate used in a deposition process. Therefore, a getter body 12 to be used in a semiconductor fabrication system should be essentially circular with a thickness between about 0.5 mm and about 1 mm and a lateral dimension between about 150 mm to about 300 nm. A getter body 12 for use in semiconductor fabrication can also include a flat segment as would a semiconductor substrate. Likewise, a getter body 12 to be used in the production of flat panel displays should be essentially rectangular with a thickness between about 1 mm and 5 mm and a lateral dimension between about 10 cm and 1 meter.

Getter body 12 can be formed of any getter material known in the art, however, some compositions will be preferable for a particular application due to various considerations. For example, certain species of contaminants like water vapor may be especially problematic in a particular process and a getter with a composition more favorable to gettering water vapor would therefore be desirable. A getter material generally suited to the purposes of the present invention is an alloy manufactured and sold by the assignee of this application under the name St 787. St 787 has a composition of 80.8 weight percent Zr 14.2 weight percent Co and 5 weight percent A, where A may be any element chosen from the group including yttrium, lanthanum, and the rare earth elements or any mixture thereof. Other alloys manufactured and sold by the assignee that are generally suited to the present invention include an alloy with a composition of 84 weight percent Zr and 16 weight percent Al distributed under the name St 101®, and an alloy with a composition of 70 weight percent Zr 24.6 weight percent V and 5.4 weight percent Fe distributed under the name St 707. Mechanical mixtures of the two last cited alloys with either zirconium metal or titanium metal can be advantageous due to their good mechanical characteristics and resistance to particle shedding. An example of such a mixture is manufactured and sold by the assignee under the name St 121. This mixture comprises 70 weight percent titanium powder and 30 weight percent of a powder of St 101®.

The getter body 12 may be formed from sheet, cast as an ingot and sliced, or made from powder compacted under high pressure, however, it is preferably made by sintering a powder of at least one getter material. Sintering provides for good mechanical strength as well as the ability to control the porosity of the getter body 12. However, substrates used in deposition processes are commonly both broad and thin, and a sintered getter body 12 having such a shape and a desirably high porosity may not have sufficient mechanical strength. Were a getter body 12 to fail for insufficient mechanical strength it could easily damage automated handling equipment and contaminate vacuum chambers and systems with particulates.

Figure 2:
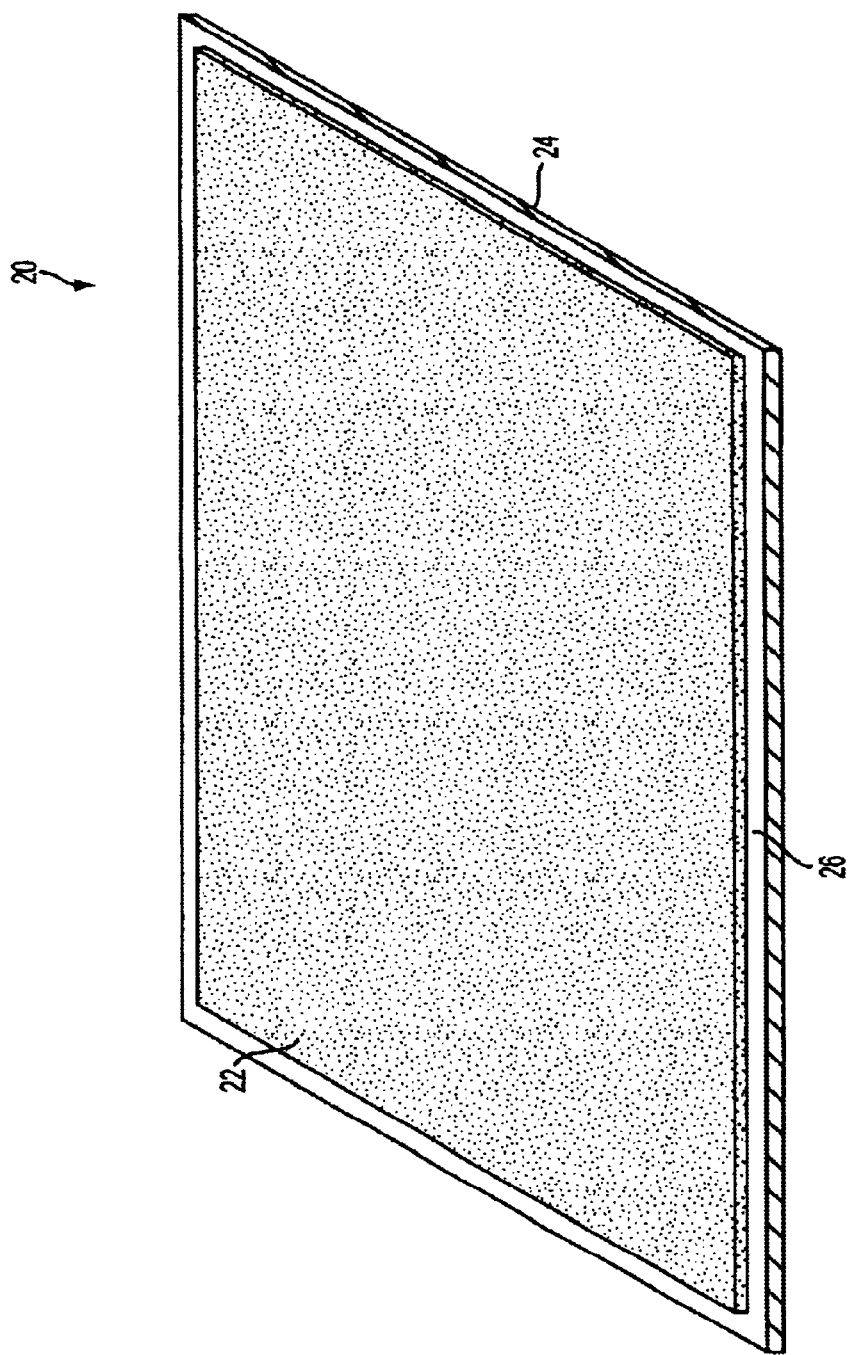
FIG. 2 shows another embodiment in which the getter body includes a support with a getter material layer.

Consequently, it is preferable to form a getter layer 22 of a getter material onto a support 24 provided to impart additional mechanical strength. FIG. 2 illustrates a getter device 20 formed of a getter layer 22 on a substrate 24 and that can be used in a system for manufacturing flat panel displays. Support 24 can be formed of any material getter layer 22 will adhere to well. However, it is advantageous that support 24 be able to maintain good mechanical strength and have low outgassing characteristics at temperatures as high as an activation temperature of the getter material of getter layer 22. The materials that best meet these requirements include metals and their alloys, in particular aluminum, steel, titanium, and nickel-chromium alloys, and silicon, ceramics and glasses. Support 24 has essentially the same shape as a substrate used in a deposition process so that the getter device 20 will have essentially the same shape as a substrate used in a deposition process.

Getter layer 22 can be formed of any getter material known in the art, however, some compositions will be preferable for particular applications due to various considerations, as described above with respect to getter body 12. Additionally, however, getter layer 22 should be formed of a getter material that can be readily deposited by the chosen deposition technique. As previously described, getter layer 22 can be deposited on a support 24 by PVD. Additionally, getter layer 22 can be deposited in the form of a powder by spraying a suspension of particles of the desired getter material in a suitable solvent onto a heated support 24, or by either an electrophoretic or serygraphic technique.

As shown in FIG. 2, getter device 20 can further include a rim portion 26. The serygraphic technique described above is well suited for the formation of patterned deposits, such as shown in FIG. 2, where a portion of the support 24 is coated with getter layer 22 while rim portion 26 remains uncoated. Rim portion 26 should be no larger than necessary because any increase in rim portion 26 detracts from the amount of area devoted to getter layer 22 and therefore reduces the gettering capacity of getter device 20. Rim portion 26, however, should provide enough uncoated area around the perimeter of the of support 24 so that the getter device 20 can be manipulated by automated handling equipment without tangs, clamps, or guides coming into contact with the getter layer 22. The acceptable width for rim portion 26 will vary according to the type of substrate the getter device 20 is modeled on, however, in most instances it will be in the range of approximately 2 mm to 10 mm.

Figure 3:
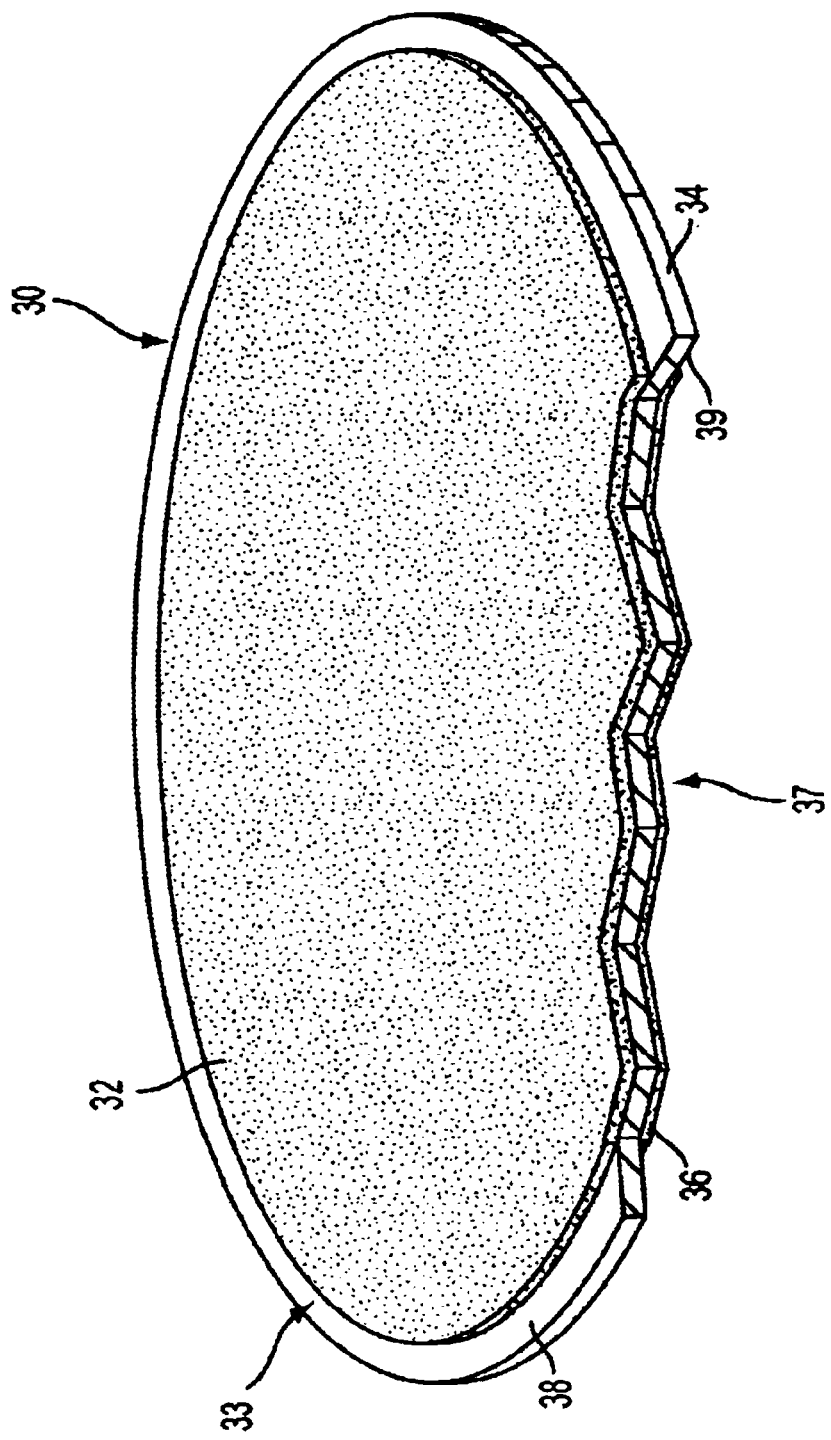
FIG. 3 shows another embodiment in which the getter body includes a support with two getter material layers.

FIG. 3 illustrates a getter device 30 formed of a first getter layer 32 of a getter material deposited onto a first face 33 of a support 34 and a second getter layer 36 of a getter material deposited onto a second face 37 of support 34. Support 34 can be formed of any material that the getter layers 32 and 36 will adhere to well. However, it is advantageous that the support 34 be able to maintain good mechanical strength and have low outgassing characteristics at temperatures as high as the higher activation temperature between the getter materials of getter layers 32 and 36. The materials that best meet the requirements for support 34 include metals and their alloys, in particular aluminum, steel, titanium, and nickel-chromium alloys, and silicon, ceramics and glasses. Support 34 has essentially the same shape as a substrate used in a deposition process so that the finished getter device 30 will have essentially the same shape as a substrate used in a deposition process.

Getter layers 32 and 36 can be formed of any getter material known in the art, however, some compositions will be preferable for particular applications due to various considerations, as described above with respect to getter body 12. Additionally, however, getter layers 32 and 36 should be formed of getter materials that can be readily deposited by the chosen deposition technique. As previously described, getter layers 32 and 36 can be deposited on a support 24 by PVD. Alternately, getter layers 32 and 36 can be deposited onto support 34 in the form of a powder by spraying a suspension of particles of the desired getter material in a suitable solvent onto a heated support 34, or by either electrophoretic or serygraphic techniques. It should be noted that in some embodiments getter layer 32 will comprise a different getter material than getter layer 36.

As shown in FIG. 3, getter device 30 can further include a first rim portion 38 on first face 33 and a second rim portion 39 on second face 37. Rim portions 38 and 39 should be no larger than necessary because any such increase necessarily detracts from the amount of area devoted to getter layers 32 and 36 and therefore reduces the gettering capacity of getter device 30. Rim portions 38 and 39, however, should provide enough uncoated area around the perimeter of the support 34 so that getter device 30 can be maintained in a vertical position by tangs, or can be manipulated by automated handling equipment-that commonly hold or clamp substrates by their edges.

Figure 4:
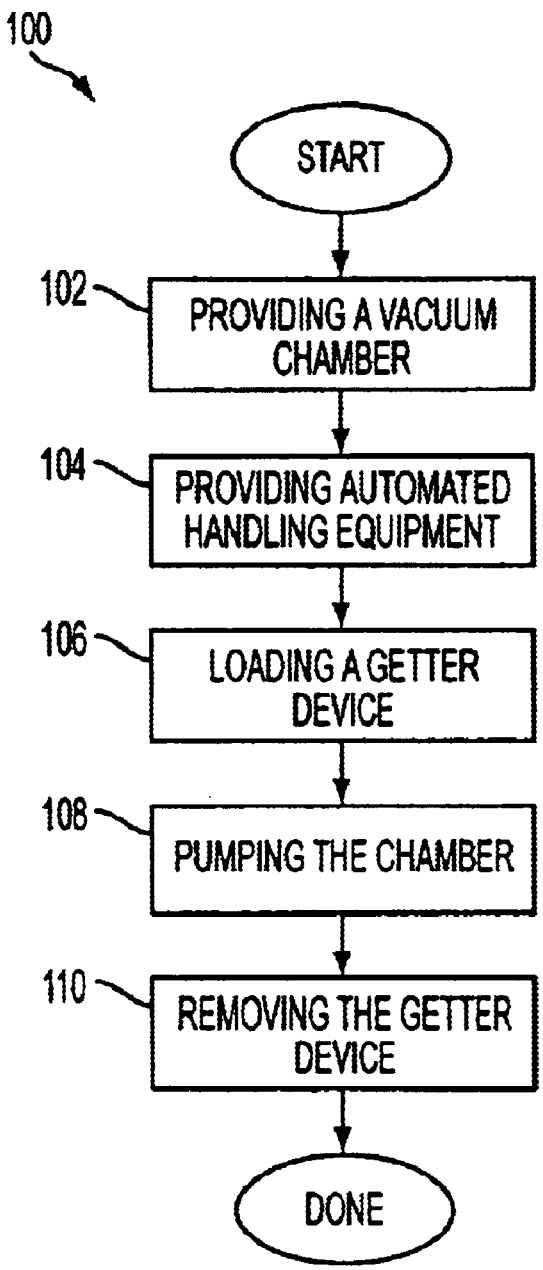
FIG. 4 shows a flow chart that illustrates a method of the present invention.

The present invention also encompasses a method for reducing evacuation time and contamination in a vacuum chamber. As shown in FIG. 4, the method 100 begins with act or operation 102, providing a vacuum chamber having a sample holder disposed therein for supporting a substrate, followed by act or operation 104, providing automated handling equipment configured to load and unload a substrate with respect to the sample holder. Next, in act or operation 106 a getter device is loaded into the chamber with the automated handling equipment such that the getter device is left supported by the sample holder. In act or operation 108 the chamber is pumped by both an external pump and the getter device to achieve a pressure. In act or operation 110 the getter device is unloaded from the chamber using the automated handling equipment.

In act or operation 102 a vacuum chamber is provided having a sample holder disposed therein for supporting a substrate. A vacuum chamber can be a deposition chamber, a conditioning chamber, or any other chamber intended to operate at a pressure below normal atmospheric pressure. The vacuum chamber includes a sample holder disposed therein for supporting a substrate. The sample holder can be a horizontal support fixed to a pedestal, as discussed above with reference to semiconductor processing. In other embodiments the sample holder can support a substrate in a vertical orientation through the use of tangs. Other sample holders known in the art may also be employed.

In act or operation 104 automated handling equipment is provided. The automated handling equipment is configured to load and unload a substrate with respect to the sample holder. Automated handling equipment for transferring substrates in and out of vacuum chambers are well known in the art as discussed above.

In act or operation 106 a getter device is loaded into the vacuum chamber by the automated handling equipment. The getter device is placed in the chamber such that it is supported by the sample holder. The getter material of the getter device may either be activated or unactivated in act or operation 106. Since the sorption of impurities by getter materials is an exothermic process, it is necessary to keep the sum of the partial pressures of all reactive gases below about $10^{-3}$ mbar whenever a getter material is in an activated state in order to prevent the getter material from combusting. Consequently, in those embodiments in which an activated getter is introduced into the vacuum chamber, act or operation 106 further includes reducing the pressure within the chamber below about $10^{-3}$ mbar before loading the getter device. Pressures of less than about $10^{-3}$ mbar can be achieved with medium and high-vacuum pumps such as turbomolecular or cryogenic pumps after an initial pump-down with a low-vacuum mechanical pump. It will be appreciated that an unactivated getter can be loaded in act or operation 106 into the chamber by hand as well as by automated means. It will be further appreciated that an activated getter can be loaded when the pressure is above about $10^{-3}$ mbar so long as the sum of the partial pressures of all of the reactive gases remains below about $10^{-3}$ mbar.

In act or operation 108 the vacuum chamber is pumped by both an external pump and the getter device to achieve a desired pressure. The desired pressure, for example, can be a base pressure. A base pressure for CVD can be in the range of $10^{-8}$–$10^{-9}$ mbar and is the most desirable pressure at which to perform a deposition from the standpoint of film quality. For PVD a base pressure can be on the order of $10^{-8}$ mbar and may be achieved prior to the vacuum chamber being back-filled with an inert gas as described above. Alternately, the desired pressure can be a preset value above the level of the base pressure. As a further alternative, the desired pressure may be a pressure at which the level of one of more contaminants falls below some predetermined value. For example, a mass spectrometer connected to the vacuum chamber can measure the levels of reactive gases within the chamber and when one or more reactive gases have been sufficiently removed the desired pressure has been achieved and act or operation 108 is completed.

The external pump is a pump located outside of the vacuum chamber that is in fluid communication with the interior of the vacuum chamber. The external pump, for example, can be a turbomolecular pump or a cryogenic pump or in some embodiments a plurality of pumps. The external pump can pump non-reactive species as well as reactive species. Here, pumping by the getter device refers to the sorption of reactive species from the atmosphere within the vacuum chamber by the getter material of the device. The getter device and the external pump, working in combination, can evacuate a vacuum chamber to a desired pressure more quickly than either one alone. Further, the external pump and the getter device working in combination can achieve a lower base pressure than either one alone. Once a desired pressure has been achieved, in act or operation 110 the getter device is unloaded from the chamber by again using the automated handling equipment.

Figure 5:
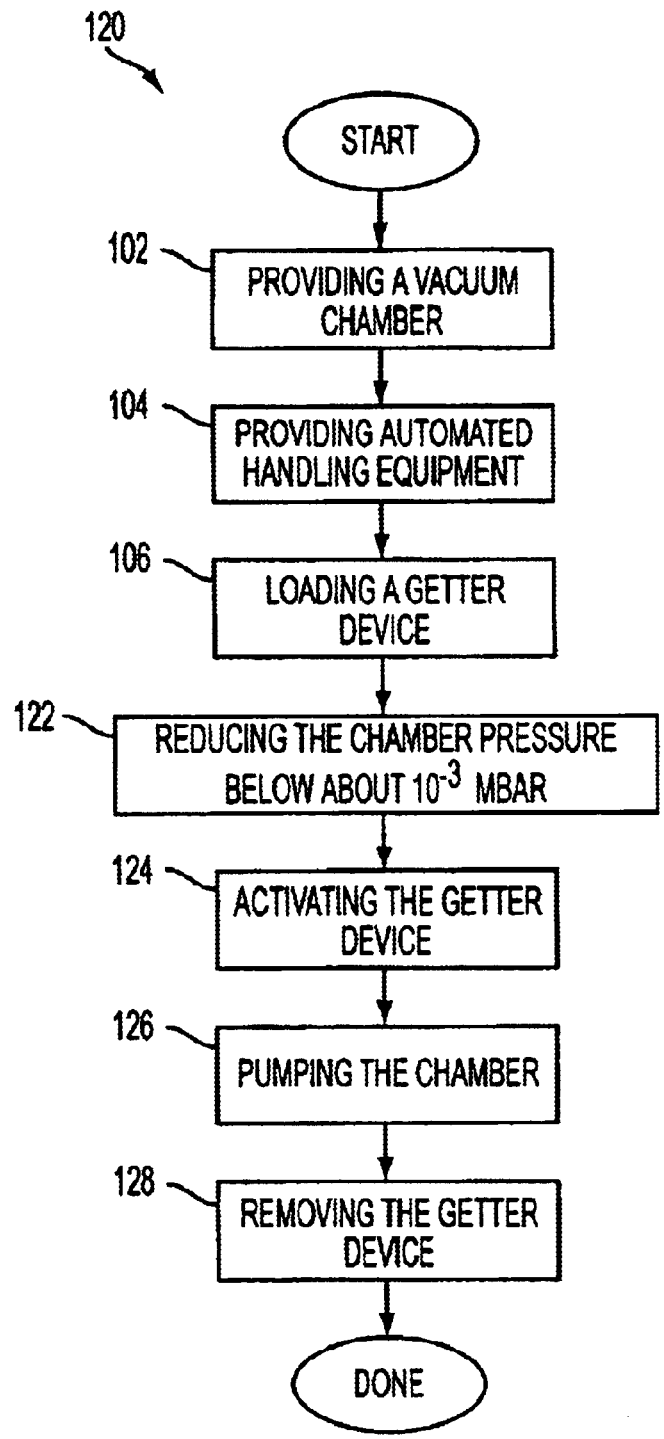
FIG. 5 shows a flow chart that illustrates an alternative embodiment thereof.

FIG. 5 illustrates another method 120 of the present invention. Method 120 proceeds essentially as method 100 through acts or operations 102–106. In act or operation 122, however, the vacuum chamber is evacuated with an external pump to achieve a vacuum of below about $10^{-3}$ mbar. This is accomplished essentially as it is in act or operation 102, as described above with reference to method 100. Next, in act or operation 124 the getter material of the getter device is activated by a heater configured to heat a substrate supported on said sample holder. In some embodiments the heater is located within the vacuum chamber proximate to the sample holder, while in other embodiments the heater is disposed within a pedestal that includes the sample holder. In still other embodiments the heater is located outside of the vacuum chamber and heats a substrate with radiant heat projected through a quartz window. Whatever the source of heat, in act or operation 124 the getter material of the getter device is heated to at least its activation temperature for a sufficient length of time for the activation to be complete. The particular time and temperature employed will vary according to several parameters including the type of heater used, the particular getter material, and the thickness of the deposit or the thickness of the getter device in those embodiments that do not include a support. Generally, however, the activation temperature will be between about 300° C. to about 700° C., and the activation will take between about ten minutes and about one hour.

In act or operation 126 the chamber is pumped by both an external pump and the getter device to achieve a pressure. This is accomplished in essentially the same manner as act or operation 108 in method 100. In act or operation 128 the getter device is unloaded from the chamber using the automated handling equipment. This is likewise accomplished in essentially the same manner as act or operation 110 in method 100.

Figure 6:
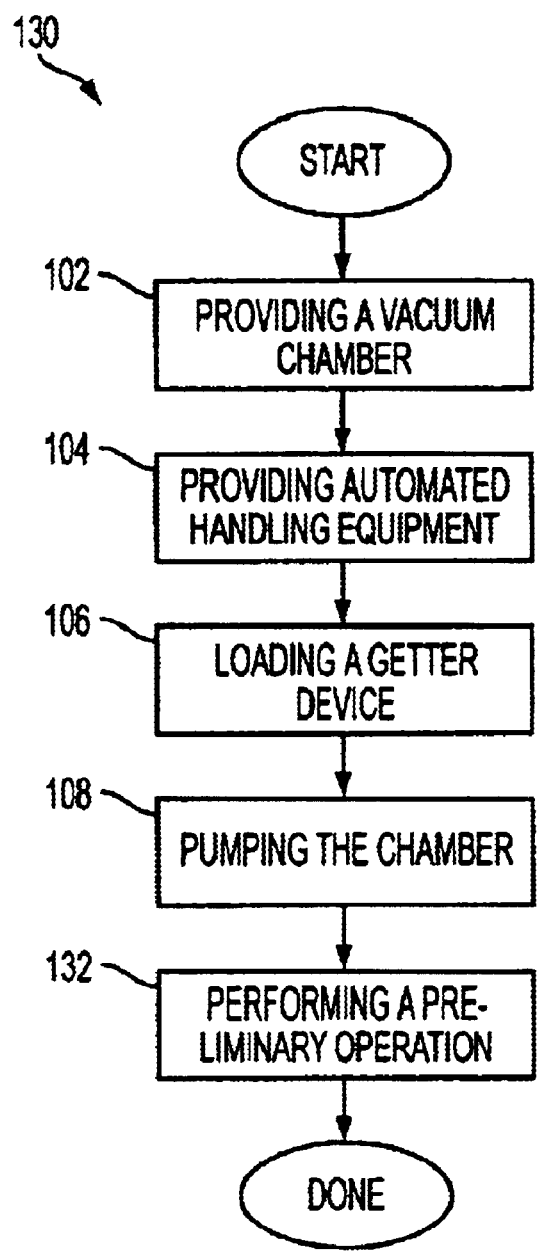
FIG. 6 shows a flow chart that illustrates another alternative embodiment thereof.

FIG. 6 shows yet another method 130 of the present invention. Method 130 proceeds essentially as method 100 through acts or operations 102–108. In act or operation 132, however, at least one preliminary operation is performed while the getter device remains within the chamber. For example, in a PVD deposition chamber one preliminary operation would be cleaning a target by performing a burn-in. It will be apparent that the getter device will serve as a dummy substrate. Even though the getter device is coated with the target material and quickly loses its ability to getter impurities, use of the getter device in place of a dummy substrate saves time by eliminating the need to first remove the getter device and then retrieve a dummy.

Figure 7:
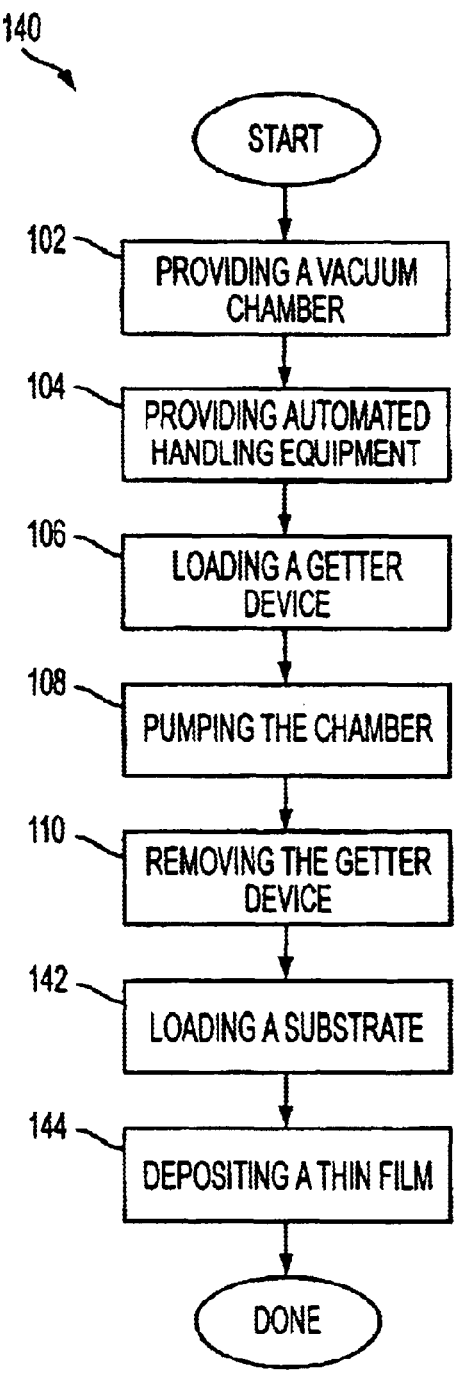
FIG. 7 shows a flow chart that illustrates a further alternative embodiment thereof.

FIG. 7 shows still another method 140 of the present invention. Method 140 is a process for depositing a thin film and proceeds essentially as method 100 through acts or operations 102–110. Thereafter, in act or operation 142, a substrate is loaded into the vacuum chamber with the automated handling equipment so that the substrate is supported on the sample holder. Finally, in act or operation 144 a thin film is deposited on the substrate. It will be appreciated that a thin film prepared according to method 140 can have fewer defects because the use of the getter device allows the deposition to be performed in a cleaner environment. Thus, use of method 140 improves yields where products are fabricated at least in part through the deposition of a thin film on a substrate. It will also be appreciated that because method 140 reduces the time necessary to achieve a desired vacuum level use of method 140 can improve yield per unit of time.

It will be appreciated that the getter device of the present invention can be used at times other than at the beginning of a production run. Consequently, in some embodiments of the method of the present invention, after a thin film is deposited in act or operation 144, the coated substrate is removed and acts or operations 142 through 144 are cycled through repeatedly in order to deposit thin films on a plurality of substrates. Because each new substrate can introduce contamination into the chamber, in some of these embodiments the cycle can be interrupted after a set number of substrates have been processed and acts or operations 106 through 110 can be repeated. Alternately, instead of reintroducing the getter device into the vacuum chamber after a set number of substrates have been processed, the getter device can be reintroduced only as needed. In these embodiments the need for reintroducing the getter device can be determined by monitoring the degree of contamination within the chamber, for example, with a mass spectrometer connected to the chamber. Thus, when the contamination rises above a predetermined value the cycle of depositions is interrupted and acts or operations 106 through 110 are repeated. Additionally, after the last substrate in a production run has been coated, acts or operations 106 through 110 can be repeated in order to improve conditions in the vacuum chamber in preparation for the next production run.

Figure 8:
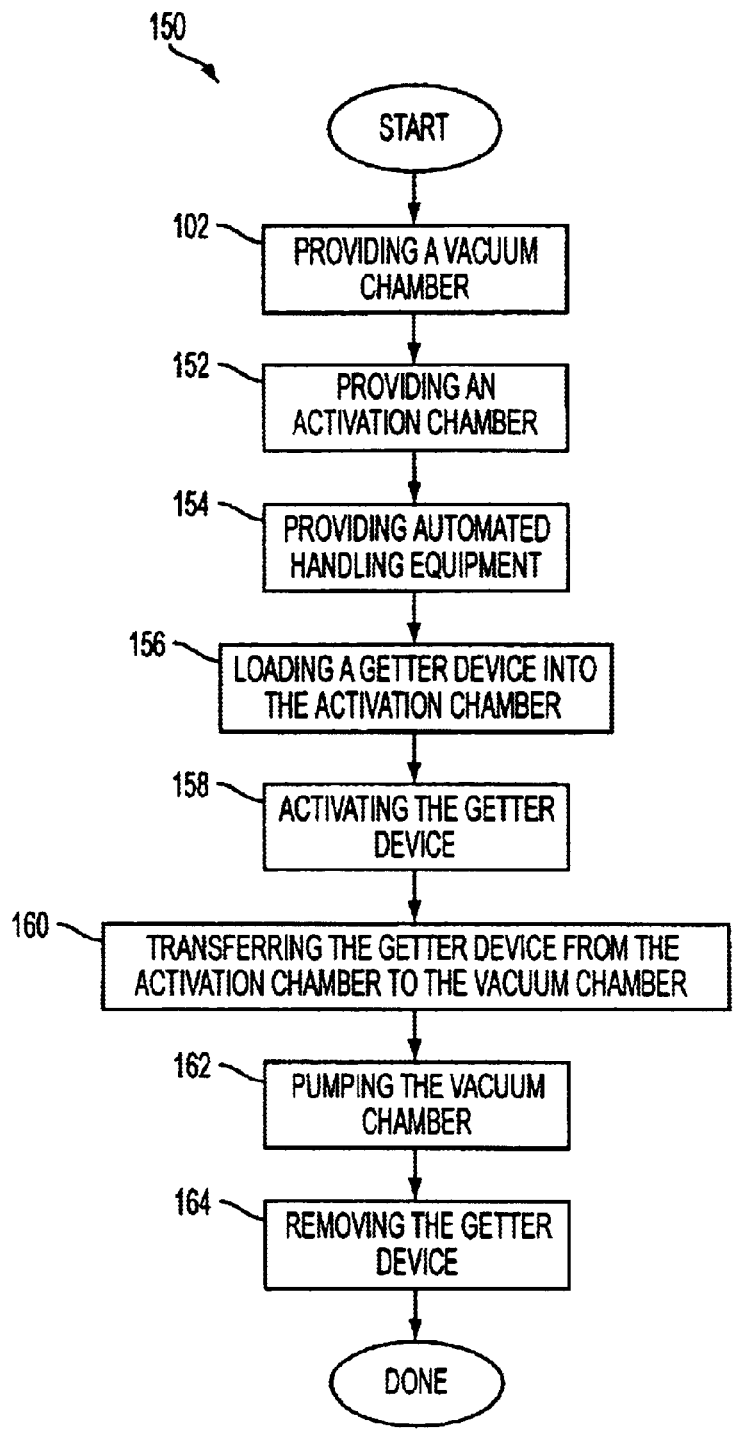
FIG. 8 shows a flow chart that illustrates still another alternative embodiment thereof.

FIG. 8 shows still another method 150 of the present invention. Method 150 is a process for reducing contamination in a vacuum chamber similar to method 100 but differing in that the getter material of the getter device is activated in a chamber separate from the vacuum chamber. In act or operation 102 a vacuum chamber is provided having a first sample holder disposed within for supporting a substrate. In act or operation 152 an activation chamber is provided having a second sample holder disposed within for supporting a substrate and a heater configured to heat the substrate. The activation chamber is preferably a preconditioning chamber that ordinarily is used to heat substrates that are then moved onto a subsequent processing step such as a thin film deposition. A separate chamber to heat substrates is commonly provided to improve the over-all efficiency of a fabrication system. Similarly, greater efficiency can be obtained in the use of the getter devices of the present invention by activating the getter material in a chamber separate from the deposition chamber. As discussed above, the heater can be disposed within the activation chamber and proximate to the sample holder or within a pedestal that includes the sample holder. Alternately, the heater can be located outside of the activation chamber and project radiant heat onto the getter device through a quartz window.

In act or operation 154 automated handling equipment is provided. The automated handling equipment is configured to load and unload a substrate with respect to the first and second sample holders. Automated handling equipment for transferring substrates in and out of vacuum chambers are well known in the art as discussed above.

In act or operation 156 a getter device is loaded into the activation chamber by the automated handling equipment. The getter device is placed in the activation chamber such that it is supported by the second sample holder. Since the getter material is not yet activated when placed on the second sample holder, it is not necessary that the pressure in the activation chamber be below about $10^{-3}$ mbar.

In act or operation 158 the getter device is heated to activate the getter material. To perform act or operation 158 a pressure of less than about $10^{-3}$ mbar must be obtained in the activation chamber to prevent combustion of the getter material. As previously described, pressures of less than about $10^{-3}$ mbar can be achieved with medium and high-vacuum pumps such as turbomolecular or cryogenic pumps after an initial pump-down with a low-vacuum mechanical pump. It will be appreciated that a pressure of less than about $10^{-3}$ mbar may be obtained either before the getter device is loaded in act or operation 156, or after the getter device is loaded as part of act or operation 158. Once a safe pressure has been obtained and heating is commenced, the getter material of the getter device is heated to at least its activation temperature for a sufficient time for the activation to be complete. Generally, the activation temperature will be between about 300° C. to about 700° C., and the activation will take between about ten minutes and about one hour.

In act or operation 160 the getter device is transferred from the activation chamber to the vacuum chamber with the automated handling equipment such that the getter device is supported on the first sample holder. Thereafter, in act or operation 162 the vacuum chamber is pumped with an external pump and the getter device to achieve a pressure, and in act or operation 164 the getter device is unloaded from the chamber with the automated handling equipment. Act or operation 162 is essentially the same as act or operation 108, and act or operation 164 is essentially the same as act or operation 110.

Figure 9:
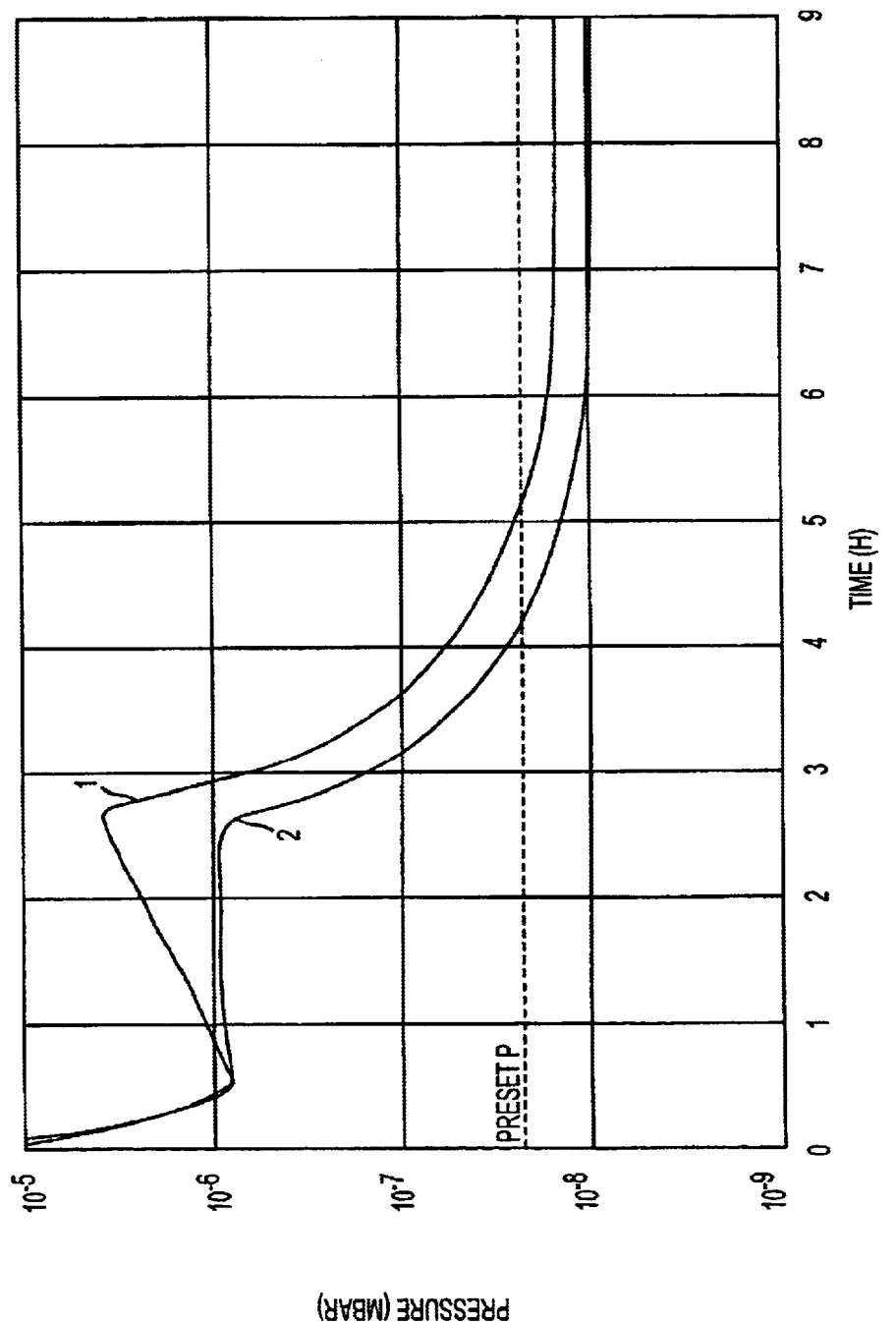
FIG. 9 shows a comparison of the pressure in a PVD chamber during pump-down cycles performed according to the prior art and according to the present invention.

The invention will be further illustrated by means of the following examples. Example 1 describes a typical pump-down cycle for a PVD deposition chamber and Curve 1 in FIG. 9 illustrates a measured pressure in the chamber during that cycle. Example 2 describes a pump-down cycle for the same PVD deposition chamber as in Example 1 employing a getter device of the present invention. Curve 2 in FIG. 9 illustrates the measured pressure in the chamber during the cycle employing the getter device.

EXAMPLE 1

The pressure in a PVD deposition chamber was continuously monitored while a pump-down cycle was performed. The measured pressure in the chamber during this cycle is shown in FIG. 9 as curve 1. The chamber included a pedestal supporting a sample-holder and further included an internal electrical resistance heater. The chamber also included two quartz lamps located on two opposing side walls. A rotary pump and a cryogenic pump were connected to the chamber by a port to perform the pump-down. In order to measure pressures in the chamber below about $10^{-5}$ mbar a Bayard-Alpert manometer was employed.

At the beginning of the test the chamber was sealed and pumping was initiated. Approximately a half hour into the test, when the pressure in the chamber reached a value of about $10^{-6}$ mbar, a baking procedure was performed by heating the interior of the chamber with the quartz lamps and heating the electrical resistance heater to 500° C. After a two hour bake the chamber was allowed to cool while pumping was continued. From Curve 1 in FIG. 9 it can be seen that during the bake the pressure in the chamber increased by about half an order of magnitude. As the chamber was cooled under continuous pumping the pressure fell to a Preset pressure P at approximately 5 and a quarter hours into the test and thereafter reached a base pressure somewhat higher than $10^{-8}$ mbar at approximately 7 hours into the test.

EXAMPLE 2

The pressure in the PVD deposition chamber used in Example 1 was continuously monitored while a pump-down cycle using a getter device of the present invention was performed. The measured pressure in the chamber during this cycle is shown in FIG. 9 as curve 2. Initially, a non-activated getter device was placed on the sample holder within the chamber. The getter device consisted of a silicon wafer support having a diameter of about 200 mm and a deposit of getter material on one face. The getter material used was St 121, described above, and was deposited by screen printing to create a layer approximately 150 μm thick. The evacuation procedure described in Example 1 was then repeated. During the baking procedure, the temperature of the getter device was raised to about 500° C., primarily by the internal electrical resistance heater. The getter material was thus activated during the baking.

From Curve 2 in FIG. 9 it can be seen that during the bake the pressure in the chamber increased, but only slightly. As the chamber was cooled under continuous pumping the pressure fell to a Preset pressure P at approximately 4 and a quarter hours into the test and thereafter reached a base pressure slightly below $10^{-8}$ mbar at approximately 7 hours into the test.

As can be easily seen by comparing curves 1 and 2 in FIG. 9, the use of the getter device according to the method of the present invention produces two clear advantages over the prior art. The first advantage is that Preset pressure P was achieved in approximately 80% of the time required under the prior art, saving about an hour. The second advantage is that a base pressure was achieved by both the present invention and the prior art in approximately the same length of time, but the base pressure achieved by the present invention was significantly lower. Thus, the present inventions allows for a lower base pressure and consequently a cleaner environment in which to deposit thin films.

Although the foregoing invention has been described in some detail for purposes of clarity of understanding, it will be apparent that certain changes and modifications may be practiced within the scope of the appended claims. Accordingly, the present embodiments are to be considered illustrative and not restrictive, and the invention is not to be limited to the details given herein, but may be modified within the scope and equivalents of the appended claims.

What is claimed is:

1. A method for depositing a thin film on a substrate, comprising:

providing a vacuum chamber having a sample holder disposed therein for supporting a substrate used in a deposition process;

providing automated handling equipment configured to load and unload said substrate with respect to said sample bolder;

loading a getter device including a getter material and having essentially a shape of said substrate into said chamber with said automated handling equipment such that said getter device is supported on said sample holder;

pumping said chamber with an external pump and said getter device to achieve a desired pressure;

unloading said getter device from said chamber with said automated handling equipment;

loading a subsutrate into said chamber with said automated handling equipment such that said substrate is supported on said sample holder; and depositing a thin film on said substrate.

2. The method of claim 1 wherein said vacuum chamber, as provided, is at a pressure above about $10^{-3}$ mbar, and wherein a sum of partial pressures of all reactive gases within said vacuum chamber is below about $10^{-3}$ mbar.

3. The method of claim 1 further comprising before pumping said chamber with said external pump and said getter device:

activating said getter material with a heater configured to heat said substrate when supported on said sample holder.

4. An improved process for evacuating a vacuum chamber, said vacuum chamber used in the processing of a substrate used in a deposition, wherein a handling device is used to load and unload said substrate into and out of said vacuum chamber including the steps of:

configuring a purification getter device such that it is compatible for loading and unloading into said chamber by said handling device;

loading said getter device with said handling device and activating said getter device;

pumping said vacuum chamber to a desired vacuum pressure; and evacuating said chamber with an external pump to achieve a vacuum of below about $10^{-3}$ mbar, before said getter device is loaded into said chamber.

5. The method of claim 4 wherein said activating said getter material includes heating said getter material with a heater configured to heat said substrate.

6. The method of claim 4, wherein before loading said getter device into said chamber, said chamber is at a pressure above $10^{-3}$ mbar and wherein a sum of partial pressures of all reactive gasses within said chamber is below $10^{-3}$ mbar.

7. The method of claim 6, wherein said activating said getter material includes heating said getter material with a heater configured to heat said substrate.

8. The method of claim 4, further comprising performing at least one preliminary operation within said chamber after achieving said desired vacuum pressure.

9. The method of claim 8, wherein said at least one preliminary step includes cleaning a target.

* * * * *

UNITED STATES PATENT AND TRADEMARK OFFICE
CERTIFICATE OF CORRECTION

PATENT NO. : 6,858,254 B2
APPLICATION NO. : 10/422205
DATED : February 22, 2005
INVENTOR(S) : Conte et al.

It is certified that error appears in the above-identified patent and that said Letters Patent is hereby corrected as shown below:

Claim 1: Column 16, line 3, "bolder" should be --holder--

Claim 1: Column 16, line 14, "subsutrate" should be --substrate--

Signed and Sealed this

Fourth Day of July, 2006

JON W. DUDAS
*Director of the United States Patent and Trademark Office*